(12) United States Patent
Cho

(10) Patent No.: US 9,425,297 B2
(45) Date of Patent: Aug. 23, 2016

(54) SEMICONDUCTOR DEVICES

(71) Applicant: Samsung Electronics Co., Ltd., Suwon-si, Gyeonggi-do (KR)

(72) Inventor: Min-Hee Cho, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/698,504

(22) Filed: Apr. 28, 2015

(65) Prior Publication Data

US 2016/0087086 A1    Mar. 24, 2016

(30) Foreign Application Priority Data

Sep. 19, 2014  (KR) .................. 10-2014-0125296

(51) Int. Cl.
| | |
|---|---|
| *H01L 29/66* | (2006.01) |
| *H01L 29/165* | (2006.01) |
| *H01L 29/08* | (2006.01) |
| *H01L 29/10* | (2006.01) |
| *H01L 29/78* | (2006.01) |
| *H01L 27/12* | (2006.01) |

(52) U.S. Cl.
CPC ...... *H01L 29/66977* (2013.01); *H01L 27/1211* (2013.01); *H01L 29/0847* (2013.01); *H01L 29/1033* (2013.01); *H01L 29/165* (2013.01); *H01L 29/785* (2013.01)

(58) Field of Classification Search
CPC ............ H01L 29/66977; H01L 29/165; H01L 29/0874
USPC ....................................................... 257/192
See application file for complete search history.

(56) References Cited

U.S. PATENT DOCUMENTS

| 7,180,107 B2 | 2/2007 | Appenzeller et al. |
| 8,148,718 B2 | 4/2012 | Asbeck et al. |
| 8,508,994 B2 | 8/2013 | Okhonin |
| 8,629,428 B2 | 1/2014 | Verhulst et al. |
| 2007/0178650 A1 | 8/2007 | Chen et al. |
| 2011/0147840 A1* | 6/2011 | Cea .................. H01L 29/41791 257/347 |
| 2012/0223390 A1 | 9/2012 | Liang et al. |
| 2012/0241722 A1 | 9/2012 | Ikeda et al. |
| 2013/0021061 A1 | 1/2013 | Bjoerk et al. |
| 2014/0138744 A1* | 5/2014 | Kotlyar ................. H01L 29/785 257/192 |

FOREIGN PATENT DOCUMENTS

| EP | 2148374 A1 | 1/2010 |
| JP | 2012204595 A | 10/2012 |
| KR | 101368191 B1 | 2/2014 |

OTHER PUBLICATIONS

H. Kawasaki et al., "Fin FET Process and Integration Technology for High Performance LSI in 22 nm node and beyond", 7th International Workshop on Junction Technology, 2007 IEEE, pp. 3-8.

* cited by examiner

*Primary Examiner* — Douglas Menz
(74) *Attorney, Agent, or Firm* — Harness, Dickey & Pierce, PLC

(57) ABSTRACT

Semiconductor devices include an intrinsic semiconductor region on a substrate, a source region adjacent to a first side surface of the semiconductor region and doped with a p-type dopant, a drain region adjacent to a second side surface of the semiconductor region, a gate electrode on the semiconductor region, a source gate electrode on the source region, and a drain gate electrode on the drain region. The second side surface is a reverse side of the first side surface. The drain region is doped with a p-type dopant.

20 Claims, 11 Drawing Sheets

[Off]

[Drain On]

[Source On]

SEMICONDUCTOR DEVICES

CROSS-REFERENCE TO RELATED APPLICATION

This application claims the benefit of priority under 35 U.S.C. §119 from Korean Patent Application No. 10-2014-0125296, filed on Sep. 19, 2014, in the Korean Intellectual Property Office, the disclosure of which is incorporated herein in its entirety by reference.

BACKGROUND

1. Field

Some example embodiments of inventive concepts relate to semiconductor devices, and more particularly, a tunneling field-effect transistors (TFET) having a plurality of gates.

2. Related Art

Semiconductor devices have progressed toward realizing high integration and high performance. With an increase in the integration density of the semiconductor devices, a sharp rise in power consumption has become significantly problematic. To reduce power consumption, a driving voltage of the semiconductor devices should be reduced. Because a TFET controls the flows of electrons and holes by using a tunneling method, an output current may greatly vary due to a minute variation of an input voltage. That is, because the TFET is capable of operating at a low voltage, the TFET has attracted considerable attention as a low-power transistor.

SUMMARY

Some example embodiments of inventive concepts relate to semiconductor devices, and more particularly, to tunneling field-effect transistors (TFET) having a plurality of gates.

Some example embodiments of the inventive concepts provide a low-power tunneling field-effect transistor (TFET) in which current may flow in both a direction from a source to a channel, and a direction from a drain to the channel by using a plurality of gate electrodes that operate independently.

According to some example embodiments of the inventive concepts, there is provided a semiconductor device including an intrinsic semiconductor region on a substrate, a source region adjacent to a first side surface of the intrinsic semiconductor region, the source region being doped with a p-type dopant, a drain region adjacent to a second side surface of the intrinsic semiconductor region, the second side being a reverse side of the first side surface, and the drain region being doped with a p-type dopant, a gate electrode on the intrinsic semiconductor region, a source gate electrode formed on the source region, and a drain gate electrode on the drain region.

When an external voltage is applied to the drain gate electrode, the drain gate electrode may induce a tunneling field effect between the source region and the intrinsic semiconductor region.

Each of the intrinsic semiconductor region, the source region, and the drain region may have a fin shape that protrudes to a set height in a direction perpendicular to a top surface of the substrate, and extend in a first direction parallel to the top surface of the substrate.

The gate electrode may cover top and side surfaces of the intrinsic semiconductor region. The source gate electrode may cover top and side surfaces of the source region. The drain gate electrode may cover top and side surfaces of the drain region. The gate electrode, the source gate electrode, and the drain gate electrode may be arranged parallel to one another, and extend in a second direction perpendicular to the first direction.

The semiconductor device may further include gate electrode spacers interposed between the gate electrode and the source gate electrode and between the gate electrode and the drain gate electrode. The gate electrode spacers may extend in a second direction parallel to the gate electrode.

A top surface of one of two side end portions of the source region may be exposed, The one of two side end portions may not be adjacent to the intrinsic semiconductor region. A top surface of one of two side end portions of the drain region may be exposed. The one of two side end portions may not be adjacent to the intrinsic semiconductor region.

The semiconductor device may further include a source gate spacer in contact with a reverse side of one side surface adjacent to the gate electrode, from among two side surfaces of the source gate electrode. The source gate spacer may extend in a second direction parallel to the source gate electrode.

The semiconductor device may further include a drain gate spacer in contact with a reverse side of one side surface adjacent to the gate electrode, from among two side surfaces of the drain gate electrode. The drain gate spacer may extend in a second direction parallel to the drain gate electrode.

The intrinsic semiconductor region may be formed of silicon (Si), and the source region and the drain region may be formed of germanium (Ge).

According to other example embodiments of the inventive concepts, there is provided a semiconductor device including a semiconductor layer on a substrate, the semiconductor layer extending in a first direction, and a plurality of gate electrodes covering top and side surfaces of the semiconductor layer, the plurality of gate electrodes extending in a second direction opposite to the first direction. The semiconductor layer includes an intrinsic semiconductor region, a source region formed adjacent to a first side surface of the intrinsic semiconductor region, and a drain region formed adjacent to a second side surface of the intrinsic semiconductor region. The source region and the drain region are doped with impurities of the same polarity.

The source region and the drain region may be doped with a p-type dopant.

The semiconductor layer may protrude to a set height in a third direction perpendicular to a top surface of the substrate.

The plurality of gate electrodes may include a first gate electrode, a second gate electrode, and a third gate electrode. The first gate electrode may cover top and side surfaces of the intrinsic semiconductor region. The second gate electrode may cover top and side surfaces of the source region. The third gate electrode may cover top and side surfaces of the drain region.

Gate electrode spacers may be interposed between the plurality of gate electrodes and electrically insulate the plurality of gate electrodes from one another.

The semiconductor device may further include a buried insulating layer interposed between the semiconductor layer and the substrate.

According to further example embodiments, a semiconductor device includes a semiconductor layer consisting of a first semiconductor region interposed between a second semiconductor region and a third semiconductor region. The first semiconductor region is an undoped semiconductor region or an i-type semiconductor region. The second and third semiconductor regions are each formed of a material having a smaller work function than a material forming the first semiconductor region. The semiconductor device further includes a metal pattern insulated from the semiconductor layer, the metal pattern including a plurality of gate electrodes over a respective one of the first, second and third semiconductor regions.

A dopant concentration of the second and third semiconductor regions may be about $1 \times 10^{16}$ cm$^3$ to about $1 \times 10^{18}$ cm$^3$.

The metal pattern may extend in a first direction over the semiconductor layer. The semiconductor layer may extend in a second direction over a substrate, the second direction being substantially perpendicular to the first direction.

The plurality of gate electrodes may be electrically insulated from each other.

The second and third semiconductor regions may include p-type dopants or n-type dopants.

BRIEF DESCRIPTION OF THE DRAWINGS

Example embodiments of the inventive concepts will be more clearly understood from the following detailed description taken in conjunction with the accompanying drawings in which:

FIGS. 5A through 8A are perspective views illustrating sequential processes of a method of manufacturing a semiconductor device according to other example embodiments of the inventive concepts;

FIGS. 5B through 8B are cross-sectional views illustrating sequential processes of the method of manufacturing the semiconductor device according to the other example embodiments of the inventive concepts;

DETAILED DESCRIPTION OF THE EMBODIMENTS

Figure 1A:
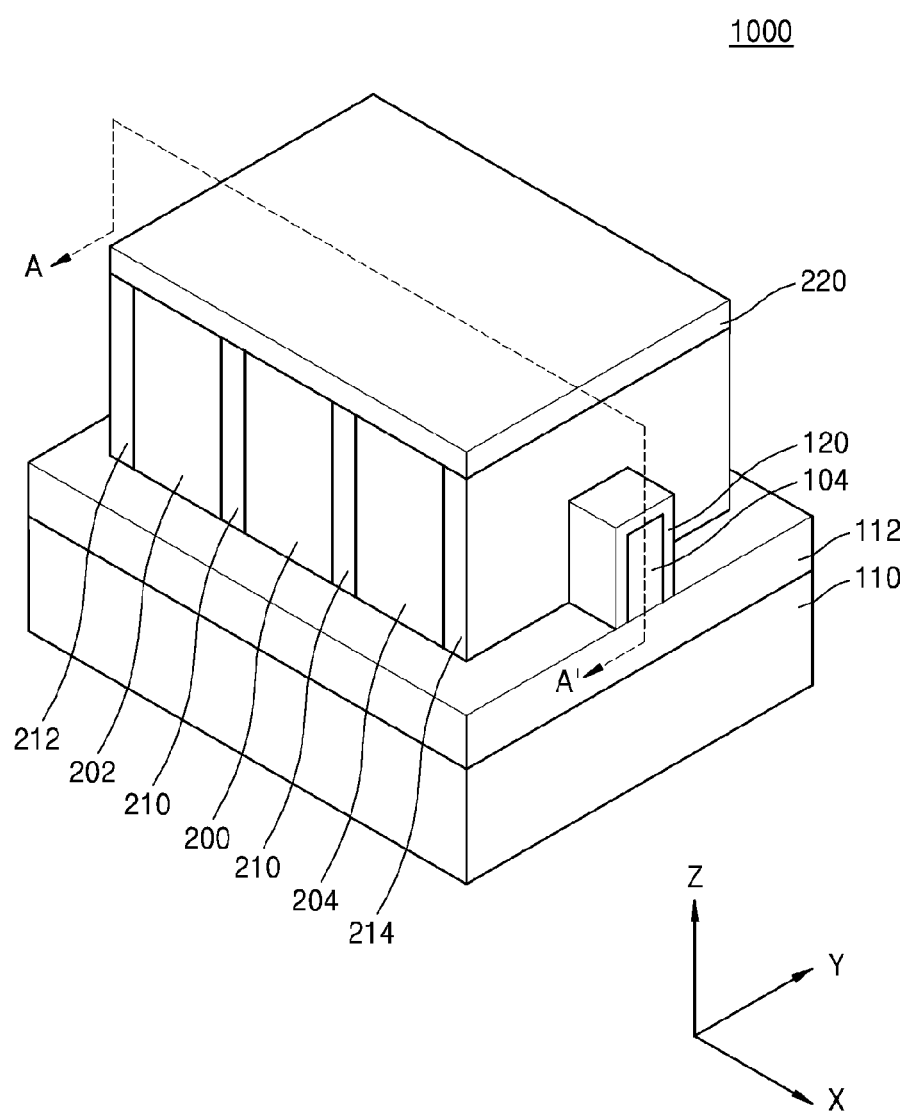
FIG. 1A is a perspective view of a semiconductor device according to some example embodiments of the inventive concepts.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

As used herein the terminology "intrinsic semiconductor region" refers to a semiconductor region that does not have any significant dopain species present so that the number of charge carriers in the semiconductor region is determined by the properties of the material itself, opposed to the amount of impurities. The intrinsic semiconductor region may be an undoped semiconductor region, or an i-type semiconductor region.

Example embodiments of inventive concepts relate to a semiconductor device, and more particularly, to a tunneling field-effect transistor (TFET) having a plurality of gates.

Figure 1B:
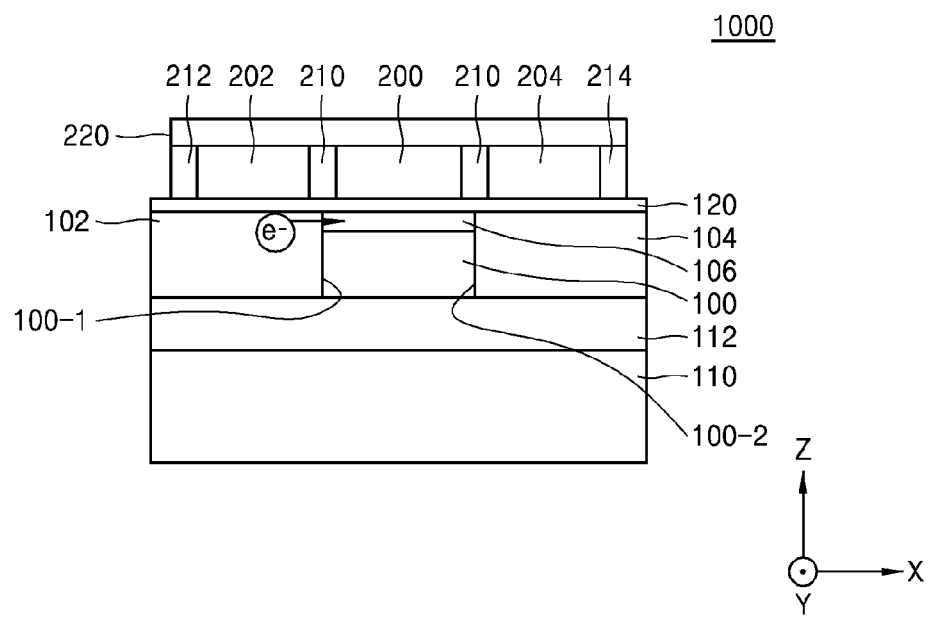
FIG. 1B a cross-sectional view of the semiconductor device according to some example embodiments of the inventive concepts.

FIG. 1A is a perspective view of a semiconductor device according to some example embodiments of the inventive concepts, and FIG. 1B is a cross-sectional view taken along a line A-A' of the semiconductor device.

Referring to FIGS. 1A and 1B, a semiconductor device 1000 may include a substrate 110, a buried insulating layer 112 formed on the substrate 110, an intrinsic semiconductor region 100 formed on the buried insulating layer 112, a source region 102 formed adjacent to a first side surface of the intrinsic semiconductor region 100, a drain region 104 formed adjacent to a second side surface of the intrinsic semiconductor region 100 opposite to the first side surface, a gate electrode 200 formed on the intrinsic semiconductor region 100, a source gate electrode 202 formed on the source region 102, and a drain gate electrode 204 formed on the drain region 104. Gate electrode spacers 210 may be formed on two sidewalls of the gate electrode 200. A source gate electrode spacer 212 may be formed on one sidewall of the source gate electrode 202, and a drain gate electrode spacer 214 may be formed on one sidewall of the drain gate electrode 204.

The substrate 110 may include silicon (Si), for example, crystalline silicon, polycrystalline silicon (poly-Si), or amorphous silicon (a-Si). In some example embodiments, the substrate 110 may include germanium (Ge) or a compound semiconductor, such as silicon germanium (SiGe), silicon carbide (SiC), gallium arsenide (GaAs), indium arsenide (InAs), or indium phosphide (InP).

In example embodiments, the substrate 110 may have a silicon-on-insulator (SOI) structure. The buried insulating layer 112 may be formed on a top surface of the substrate 110. The buried insulating layer 112 may be, for example, a buried oxide (BOX) layer. The substrate 110 on which the buried insulating layer 112 is formed may reduce a leakage current.

A fin-type semiconductor layer 100, 102, and 104 may be formed on the buried insulating layer 112. The semiconductor layer 100, 102, and 104 may include the intrinsic semiconductor region 100, the source region 102, and the drain region 104. Although each of the intrinsic semiconductor region 100, the source region 102, and the drain region 104 may be formed of a different semiconductor material from the substrate 110, the intrinsic semiconductor region 100, the source region 102, and the drain region 104 may be integrally formed of the same semiconductor material as the substrate 110 in terms of a manufacturing process. The semiconductor layer 100, 102, and 104 may be formed of the same semiconductor or different semiconductors including at least one of silicon (Si), silicon germanium (SiGe), germanium (Ge), and a Group III-V compound semiconductor material. In example embodiments, the intrinsic semiconductor region 100 may be formed of silicon, and the source region 102 and the drain region 104 may be formed of germanium. However, in example embodiments of the inventive concepts, materials forming the intrinsic semiconductor region 100, the source region 102, and the drain region 104 are not limited thereto.

The semiconductor layer 100, 102, and 104 may protrude to a set (or, alternatively, predetermined) height in a third direction (Z direction) perpendicular to the top surface of the substrate 110, and extend in a first direction (X direction) parallel to the top surface of the substrate 110. The source region 102 may be formed adjacent to a first side surface 100-1 of the intrinsic semiconductor region 100, and the drain region 104 may be formed adjacent to a second side surface 100-2 of the intrinsic semiconductor region 100. That is, the source region 102 and the drain region 104 may be symmetrically disposed with respect to the intrinsic semiconductor region 100.

The intrinsic semiconductor region 100 may include an undoped intrinsic semiconductor. The source region 102 and the drain region 104 may include a semiconductor doped with impurities having the same polarity. In example embodiments, the source region 102 and the drain region 104 may be doped with a p-type dopant, for example, boron (B), gallium (Ga), or indium (In). A dopant concentration of the source region 102 and the drain region 104 may range from about $1 \times 10^{16}$ cm$^{-3}$ to about $1 \times 10^{18}$ cm$^{-3}$. However, the above-described range of the dopant concentration of the source region 102 and the drain region 104 is only an example, thus the inventive concepts are not limited thereto. In some other example embodiments, the source region 102 and the drain region 104 may be doped with an n-type dopant, for example, phosphorus (P), arsenic (As) or antimony (Sb).

A gate insulating layer 120 may be formed on top and side surfaces of the semiconductor layer 100, 102, and 104. The gate insulating layer 120 may include a silicon oxide layer ($SiO_2$). In example embodiments, the gate insulating layer 120 may include a high-k dielectric layer having a higher dielectric constant (k) than a silicon oxide layer. For example, the gate insulating layer 120 may include a high-k dielectric layer having a dielectric constant of about 10 to about 25. The gate insulating layer 120 may include, for example, any one of a silicon oxide layer ($SiO_2$), a strontium oxide layer (SrO), a silicon nitride layer ($Si_3N_4$), an aluminum oxide layer ($Al_2O_3$), a magnesium oxide layer (MgO), a scandium oxide layer ($Sc_2O_3$), a gadolinium oxide layer ($Gd_2O_3$), a yttrium oxide layer ($Y_2O_3$), a samarium oxide layer ($Sm_2O_3$), a hafnium oxide layer ($HfO_2$), a zirconium oxide layer ($ZrO_2$), a tantalum oxide layer ($Ta_2O_5$), a barium oxide layer (BaO), and a bismuth oxide layer ($Bi_2O_3$).

The gate electrode 200 may be disposed on the intrinsic semiconductor region 100 to cover top and side surfaces of the intrinsic semiconductor region 100. The gate electrode 200 may be parallel to the top surface of the substrate 110 and extend in a second direction (Y direction) perpendicular to the first direction (X direction). A gate insulating layer 120 may be interposed between the gate electrode 200 and the intrinsic semiconductor region 100. The gate electrode 200 may include poly-Si or a conductive material doped with a metal, such as aluminum (Al), nickel (Ni), tungsten (W), titanium (Ti), or tantalum (Ta).

The source gate electrode 202 may be disposed on the source region 102 to cover top and side surfaces of the source region 102, and the drain gate electrode 204 may be disposed on the drain region 104 to cover top and side surfaces of the drain region 104. The source gate electrode 202 and the drain gate electrode 204 may extend in the second direction (Y direction). The source gate electrode 202 and the drain gate electrode 204 may be disposed apart from and parallel to the gate electrode 200. The gate insulating layer 120 may be interposed between the source gate electrode 202 and the source region 102 and between the drain gate electrode 204 and the drain region 104. Similar to the gate electrode 200, the source gate electrode 202 and the drain gate electrode 204 may include poly-Si or a conductive material doped with a metal, such as aluminum (Al), nickel (Ni), tungsten (W), titanium (Ti), or tantalum (Ta). The source gate electrode 202 and the drain gate electrode 204 may be formed of the same material as the gate electrode 200, but example embodiments of the inventive concepts are not limited thereto.

The gate electrode spacers 210 may be formed on the two side surfaces of the gate electrode 200. That is, the gate electrode spaces 210 may be interposed between the gate electrode 200 and the source gate electrode 202, and between the gate electrode 200 and the drain gate electrode 204. The gate electrode spacers 210 may extend in the second direction (Y direction) parallel to the gate electrode 200. The gate electrode spacers 210 may be formed of an insulating material layer including a silicon oxide layer or a silicon nitride layer. The gate electrode spacers 210 may electrically insulate the gate electrode 200 from the source gate electrode 202 and the drain gate electrode 204.

The source gate electrode spacer 212 may be formed on a reverse (or opposing) side of a side surface adjacent to the gate electrode 200, out of two side surfaces of the source gate electrode 202. Similarly, the drain gate electrode spacer 214 may be formed on the reverse (or opposing) side of a side surface adjacent to the gate electrode 200, out of two side surfaces of the drain gate electrode 204. The source gate electrode spacer 212 and the drain gate electrode spacer 214 may be formed of the same insulating material as the gate electrode spacers 210.

An insulating capping layer 220 may be formed on top surfaces of the gate electrode 200, the source gate electrode 202, and the drain gate electrode 204. The insulating capping layer 220 may include an insulating material layer including a silicon oxide layer or a silicon nitride layer.

The semiconductor device 1000 according to example embodiments of the inventive concepts may include the source region 102 and the drain region 104, which may be doped with impurities having the same polarity, and symmetrically disposed with respect to the intrinsic semiconductor region 100, and the source gate electrode 202 and the drain gate electrode 204 formed on the source region 102 and the drain region 104, respectively. When an external bias voltage is applied to any one of the source gate electrode 202 and the drain gate electrode 204 and an external bias voltage is applied to the gate electrode 200, a channel region 106 may be formed on a top surface of the intrinsic semiconductor region 100. In this case, electrons ($e^-$) may move from the source region 102 into the channel region 106 so that current may flow.

Hereinafter, a method of operating the semiconductor device will be described in detail with reference to FIGS. 1B and 2A through 2C.

Figure 2A:
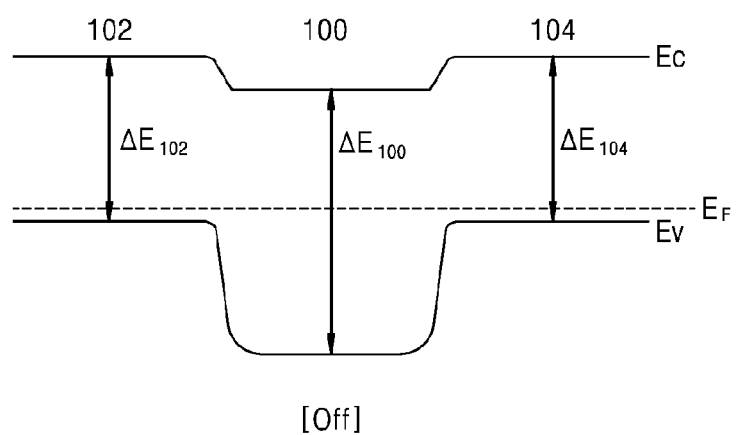
FIGS. 2A through 2C are approximate energy band diagrams of a semiconductor device according to example embodiments of the inventive concepts.
Figure 2B:
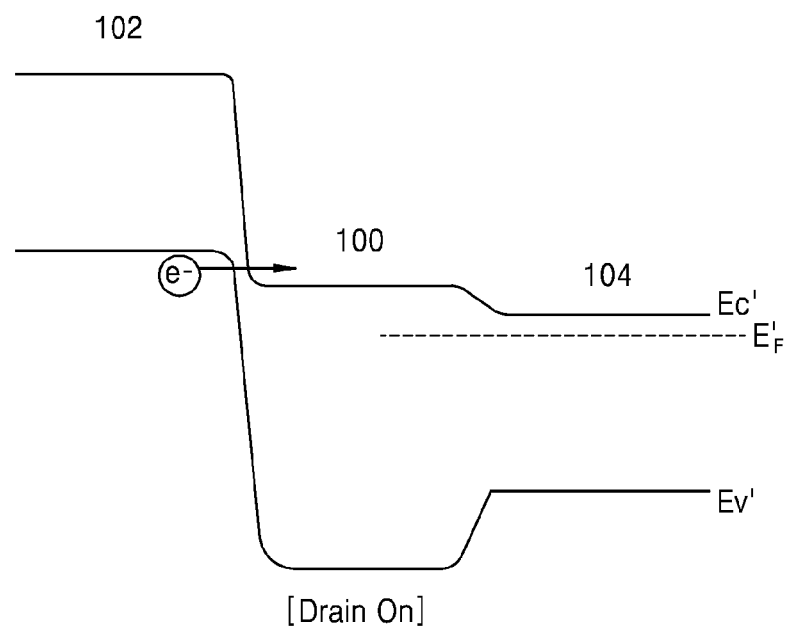
Figure 2C:
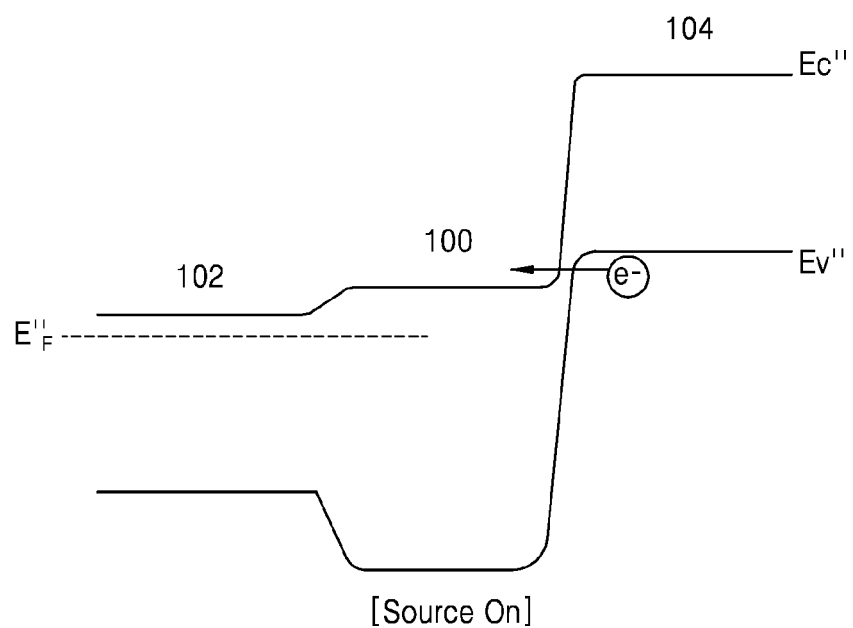

FIGS. 2A through 2C are approximate energy band diagrams for explaining a tunneling field effect of a semiconductor device according to example embodiments of the inventive concepts.

FIG. 2A is an energy band diagram showing an off state in which no external voltage is applied to the semiconductor device according to example embodiments. FIG. 2B is an energy band diagram showing a drain-on state in which an external bias voltage is applied to a drain gate electrode of the semiconductor device, and FIG. 2C is an energy band diagram showing a source-on state in which an external bias voltage is applied to a source gate electrode of the semiconductor device.

Referring to FIG. 2A, conduction bands Ec of an intrinsic semiconductor region 100, a source region 102, and a drain region 104 may have higher energy bands than valence bands Ev thereof. Because the source region 102 and the drain region 104 include a p-type doped semiconductor, the valence bands Ev of the source region 102 and the drain region 104 may have similar energy levels to a Fermi energy level $E_F$. In example embodiments, an energy bandgap $\Delta E_{102}$ of the source region 102 (i.e., a difference between the conduction band Ec and the valance band EV of the source region 102) may be higher than an energy bandgap $\Delta E_{100}$ of the intrinsic semiconductor region 100, and the energy bandgap $\Delta E_{102}$ of the source region 102 may be equal to an energy bandgap $\Delta E_{104}$ of the drain region 104, because the source region 102 and the drain region 104 are formed of germanium and the intrinsic semiconductor region 100 is formed of silicon. Silicon has a work function $\Phi_{Si}$ of about 1.1 eV, which is larger than a work function 1 $G_e$ (about 0.6 eV) of germanium. Example embodiments of the inventive concepts are not limited to a case in which the intrinsic semiconductor region 100 is formed of silicon and the source region 102 and the drain region 104 are formed of germanium. However, when the source region 102 and the drain region 104 are formed of a material having a smaller work function than the intrinsic semiconductor region 100, a driving voltage for causing a tunneling field effect may be dropped.

FIG. 2B is an energy band diagram showing a case in which a positive (+) bias voltage is applied to the drain gate electrode according to example embodiments.

Referring to FIG. 2B, when the positive bias voltage is applied to the drain gate electrode 204, electrons may crowd into an upper portion of the drain region 104. Thus, inversion may occur so that the electrons may look like dominant carriers over holes. Accordingly, the conduction band of the drain region 104 may have a reduced energy band Ec' that is close to a Fermi energy level $E_F'$ and about equal to an energy band of an n-type semiconductor. That is, the energy band of the drain region 104 may be shifted to cause band bending. In this case, when an external bias voltage is applied to the gate electrode 200, electrons (e⁻) in the valence band of the source region 102 may be tunneled into a conduction band of the channel region 106.

FIG. 2C is an energy band diagram showing a case in which a positive (+) bias voltage is applied to the source gate electrode.

Referring to FIG. 2C, when a positive bias voltage is applied to the source gate electrode 202, electrons may crowd into an upper portion of a source region 102. Thus, inversion may occur so that the electrons may look like dominant carriers over holes. Accordingly, the conduction band of the source region 102 may have a reduced energy band Ec" that is close to a Fermi energy level $E_F''$ and about equal to the energy band of the n-type semiconductor. That is, the bending of the energy band, which has occurred in the drain region 104 as described above with reference to FIG. 2B, may also occur in the source region 102. Accordingly, electrons (e⁻) in the valence band of the drain region 104 may be tunneled into the conduction band of the channel region 106.

As described with reference to FIGS. 2B and 2C, in the semiconductor device according to example embodiments of the inventive concepts, because the source region and the drain region of the semiconductor device are symmetrically formed to each other, when a positive bias voltage is applied to the source gate electrode or the drain gate electrode, electrons may be tunneled in opposite directions so that a driving current may flow in two directions. The semiconductor device according to example embodiments may be used for a peripheral circuit region Core/Peri of a dynamic random access memory (DRAM). Also, the semiconductor device according to example embodiments may be used for a static RAM (SRAM) by utilizing characteristics of a bi-directional driving current.

In some example embodiments, each of the source region 102 and the drain region 104 may include an n-type doped semiconductor. When the source region 102 and the drain region 104 include an n-type semiconductor and a negative (−) bias voltage is applied to the source gate electrode 202 or the drain gate electrode 204, an energy band of the source region 102) or the drain region 104 may be bent like an energy band of a p-type semiconductor. Accordingly, a tunneling phenomenon may occur likewise.

Figure 3:
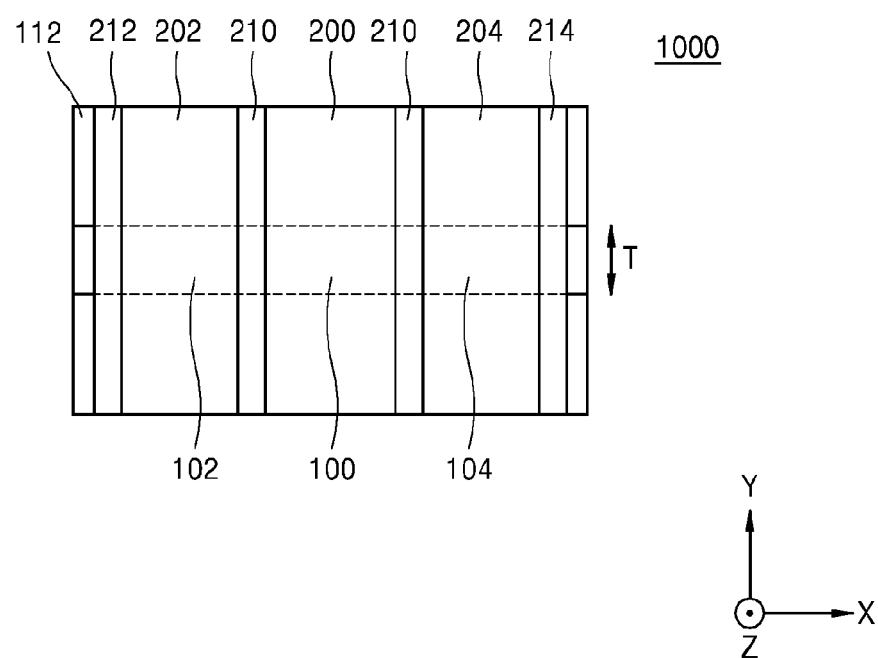
FIG. 3 is a plan view of the semiconductor device according to some example embodiments of the inventive concepts.

FIG. 3 is a plan view of the semiconductor device according to some embodiments of the inventive concepts.

Referring to FIG. 3, the gate electrode 200, the source gate electrode 202, and the drain gate electrode 204 may be arranged parallel to one another in a second direction (Y direction). The intrinsic semiconductor region 100, the source region 102, and the drain region 104 may be formed under the gate electrode 200, the source gate electrode 202, and the drain gate electrode 204, respectively. The intrinsic semiconductor region 100, the source region 102, and the drain region 104 may have the same set (or, alternatively, predetermined) thickness T.

When an external bias voltage is applied to the gate electrode 200 and the drain gate electrode 204, as the thickness T of the intrinsic semiconductor region 100, the source region 102, and the drain region 104 is reduced, a driving current (i.e., tunnelling probability) may increase. That is, as the thickness T is reduced, electrons may be tunneled more easily. In an exemplary embodiment, the thickness T may be about 10 nm.

Figure 4:
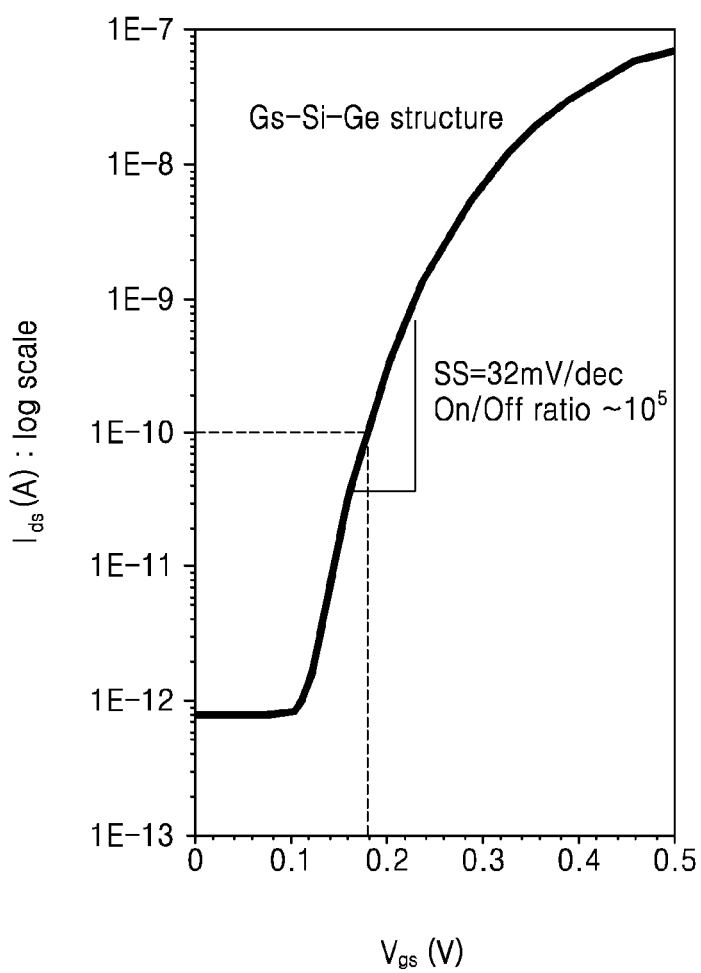
FIG. 4 is a graph showing voltage-current (IV) characteristics between a gate voltage of a semiconductor device and a drain current according to example embodiments of the inventive concepts.

FIG. 4 is a graph showing simulation results of voltage-current (V-I) characteristics between a gate voltage $V_{gs}$ and a drain current $I_{ds}$ in a semiconductor device according to example embodiments of the inventive concepts.

The simulation results shown in FIG. 4 were obtained in a case in which a source region 102, an intrinsic semiconductor region 100, and a drain region 104 were formed of germanium, silicon, and germanium, respectively. In the semiconductor device according to example embodiments of the inventive concepts, a reciprocal of a subthreshold swing SS may be 32 mV/dec. In view of the fact that a reciprocal of a subthreshold swing SS is about 60 mV/dec in a typical MOS-FET, it can be seen that the semiconductor device is rapidly turned on and off according to a gate voltage $V_{gs}$. Also, because the semiconductor device operates using a tunneling field effect, the semiconductor device may operate in low-driving-voltage conditions under which driving voltages are about 1V or lower. Thus, the semiconductor device may consume low power and operate as efficiently as typical MOS-FETs. Accordingly, the semiconductor device may embody high-energy efficiency.

FIGS. 5A through 8A are perspective views illustrating sequential processes of a method of manufacturing a semiconductor device according to other example embodiments of the inventive concepts. FIGS. 5B through 8B are cross-sectional views taken along lines 5-5' to 8-8' of FIGS. 5A through 8A, respectively.

Figure 5A:
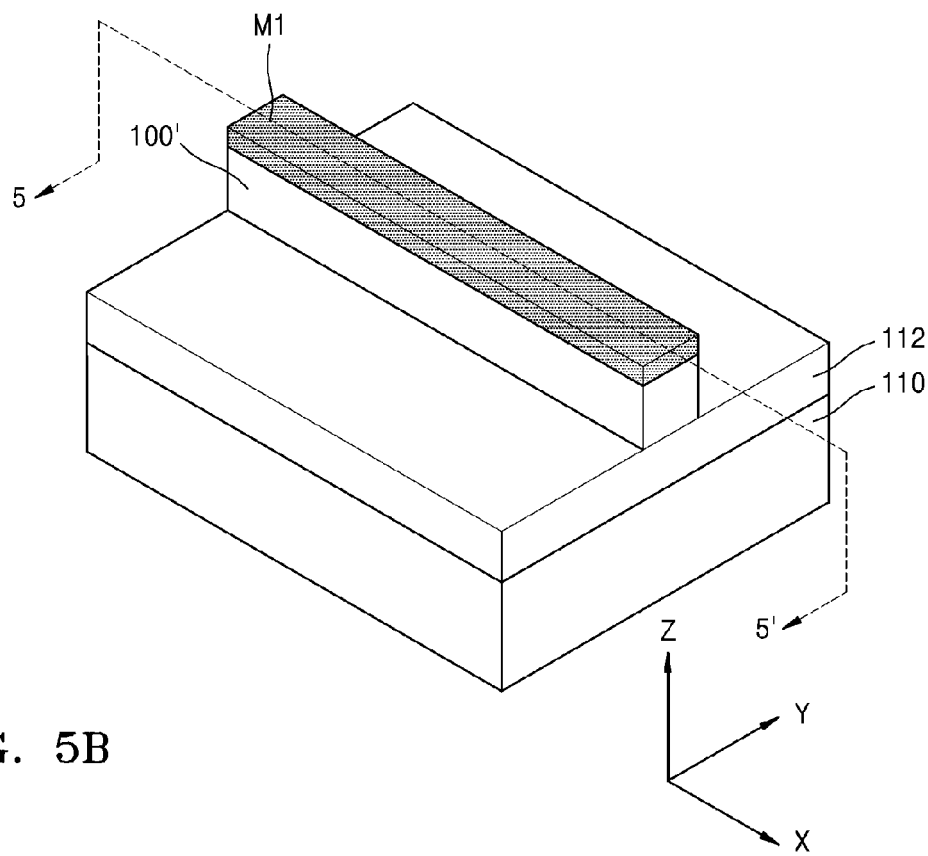
Figure 5B:
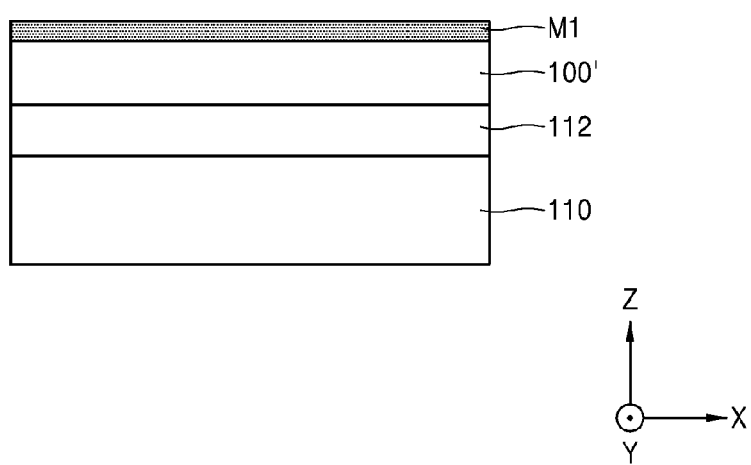

Referring to FIGS. 5A and 5B, a semiconductor layer 100' may be formed using a first mask pattern M1 on a substrate 110 having a buried insulating layer 112.

The substrate 110 may be formed of silicon including crystalline silicon, polycrystalline silicon, or amorphous silicon. However, example embodiments of the inventive concepts are not limited thereto, and the substrate 110 may be formed of germanium (Ge) or a compound semiconductor, such as silicon germanium (SiGe), silicon carbide (SiC), gallium arsenide (GaAs), indium arsenide (InAs), or indium phosphide (InP). The substrate 110 may have a silicon-on-insulator (SOI) structure. The substrate 110 may include a buried insulating layer 112. The buried insulating layer 112 may be, for example, a BOX layer.

A semiconductor material layer may be formed on the substrate 110, and covered with a first mask pattern M1. Thereafter, a portion of the semiconductor material layer, which is not covered with the first mask pattern M1, may be etched using a wet etching process or a dry etching process to form the semiconductor layer 100'.

Figure 6A:
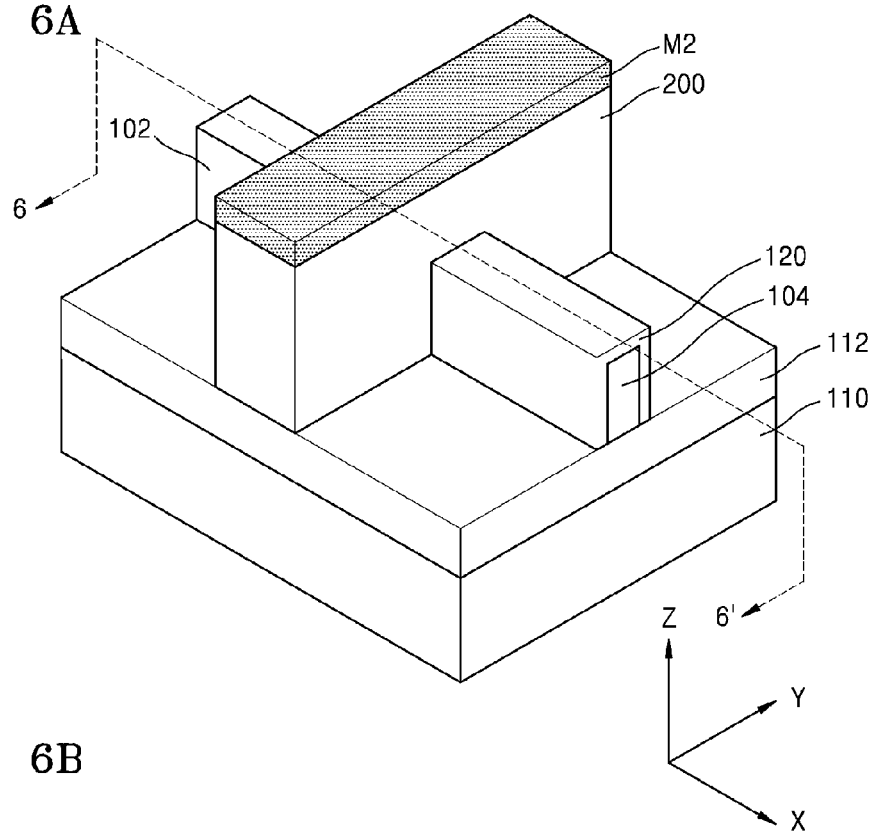
Figure 6B:
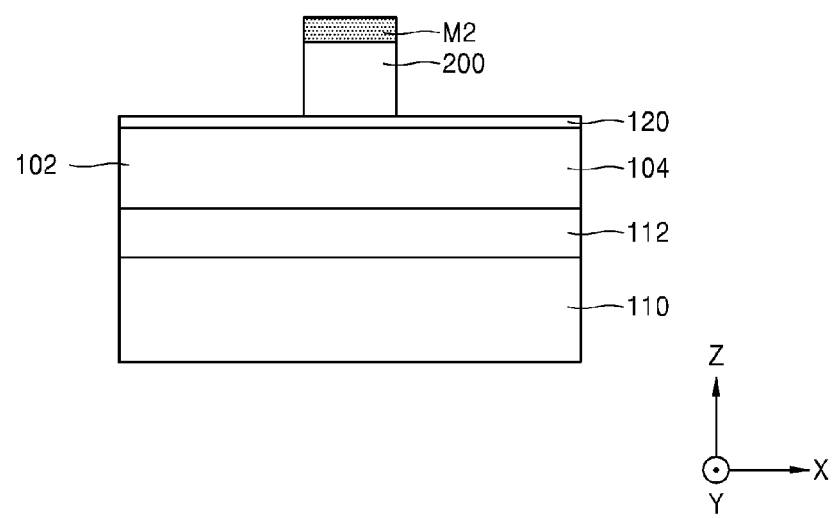

Referring to FIGS. 6A and 6B, a gate insulating layer 120 may be formed on top and side surfaces of the semiconductor layer (refer to 100' in FIGS. 5A and 5B). A gate electrode 200 may be formed to cover top and side surfaces of the gate insulating layer 120. Impurities may be doped into the semiconductor layer 100' to form a source region 102 and a drain region 104.

When the semiconductor layer 100' is formed of silicon, the gate insulating layer 120 may be a silicon oxide layer obtained using a thermal oxidation process. In another case, the gate insulating layer 120 may be formed by depositing any one of a strontium oxide layer (SrO), a silicon nitride layer ($Si_3N_4$), an aluminum oxide layer ($Al_2O_3$), a magnesium oxide layer (MgO), a scandium oxide layer ($Sc_2O_3$), a gadolinium oxide layer ($Gd_2O_3$), a yttrium oxide layer ($Y_2O_3$), a samarium oxide layer ($Sm_2O_3$), a hafnium oxide layer ($HfO_2$), a zirconium oxide layer ($ZrO_2$), a tantalum oxide layer ($Ta_2O_5$), a barium oxide layer (BaO), and a bismuth oxide layer ($Bi_2O_3$).

A gate-forming material may be deposited on a top surface of the buried insulating layer 112 and a top surface of the gate insulating layer 120, and a second mask pattern M2 having a gate electrode pattern may be formed on the gate-forming material. Thereafter, a portion of the gate-forming material, which is not covered with the second mask pattern M2, may be anisotropically etched to form the gate electrode 200. The gate-forming material may be poly-Si or a conductive material, such as aluminum (Al), nickel (Ni), tungsten (W), titanium (Ti), or tantalum (Ta).

Thereafter, p-type impurities may be doped into the semiconductor layer 100' to form the source region 102 and the drain region 104. A p-type dopant, for example, boron (B), gallium (Ga), or indium (In), may be doped into the semiconductor layer 100' using an ion implantation process.

Figure 7A:
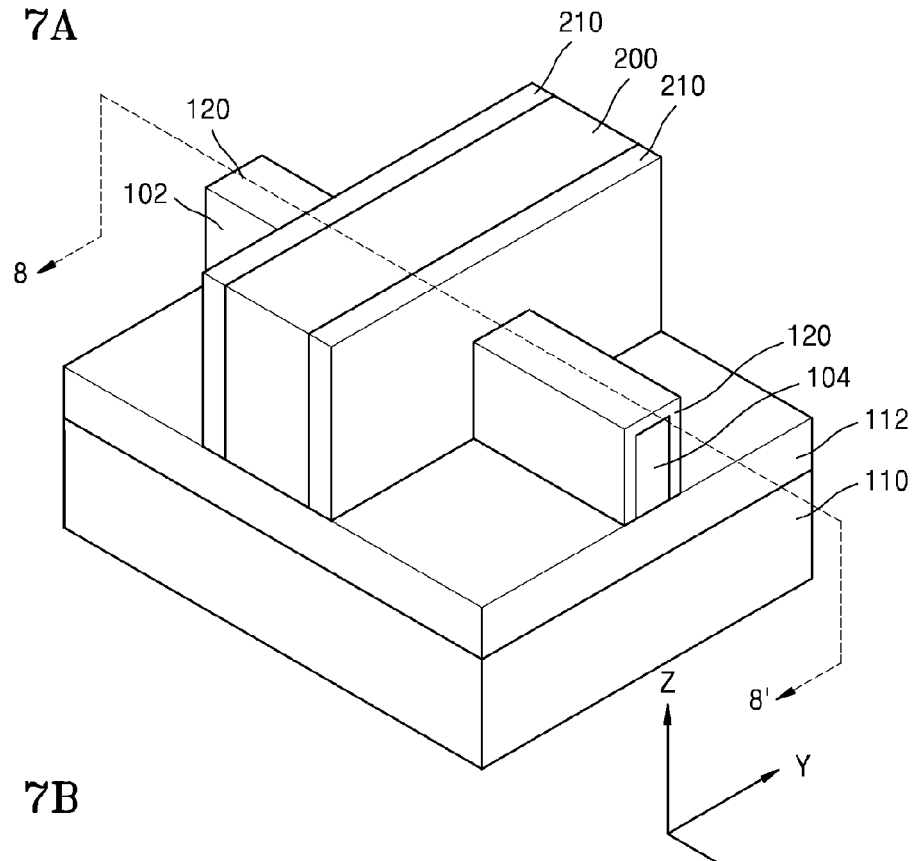
Figure 7B:
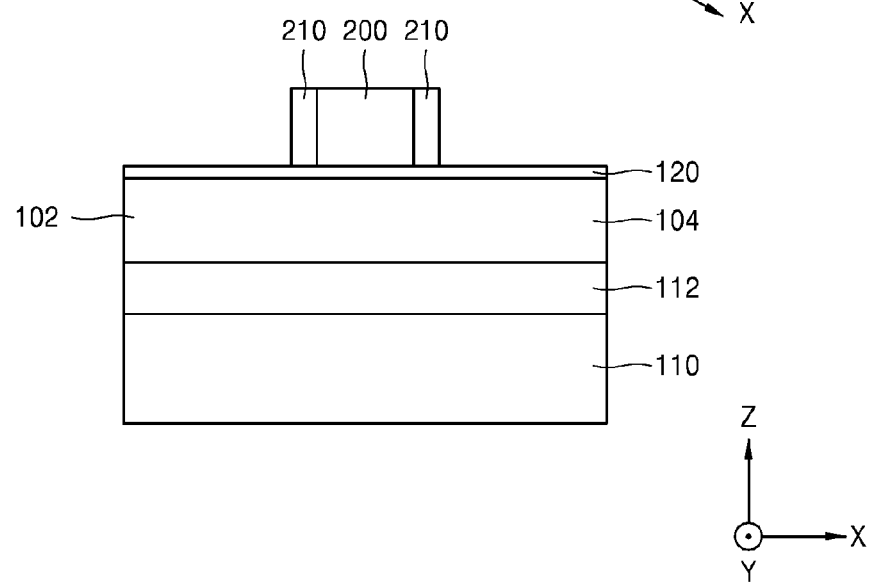

Referring to FIGS. 7A and 7B, gate electrode spacers 210 may be formed on the buried insulating layer 112 to be in contact with two side surfaces of the gate electrode 200. The formation of the gate electrode spacers 210 may include conformally depositing a material for forming gate electrode spacers to cover top and side surfaces of the gate electrode 200, a top surface of the buried insulating layer 112, and top and side surfaces of the gate insulating layer 120, and etching the material for forming the gate electrode spacers except on the side surfaces of the gate electrode 200. That is, the gate electrode spacers 210 may be formed by anisotropically etching the material for forming the gate electrode spacers, which is formed on the top surface of the gate electrode 200, the top surface of the gate insulating layer 120, and the top surface of the buried insulating layer 112. The material for forming the gate electrode spacers may include any one of a silicon oxide layer, a silicon nitride layer, or a combination thereof. The material for forming the gate electrode spacers may be formed using a chemical vapor deposition (CVD) process or an atomic layer deposition (ALD) process.

Alternatively, the formation of the gate electrode spacers 210 may include depositing a material for forming the gate electrode spacers, exposing a top surface of the gate electrode 200 by using a chemical mechanical polishing (CMP) process, covering the resultant structure with a mask for forming gate electrode spacers, and etching a portion that is not covered with the mask for forming the gate electrode spacers.

Figure 8A:
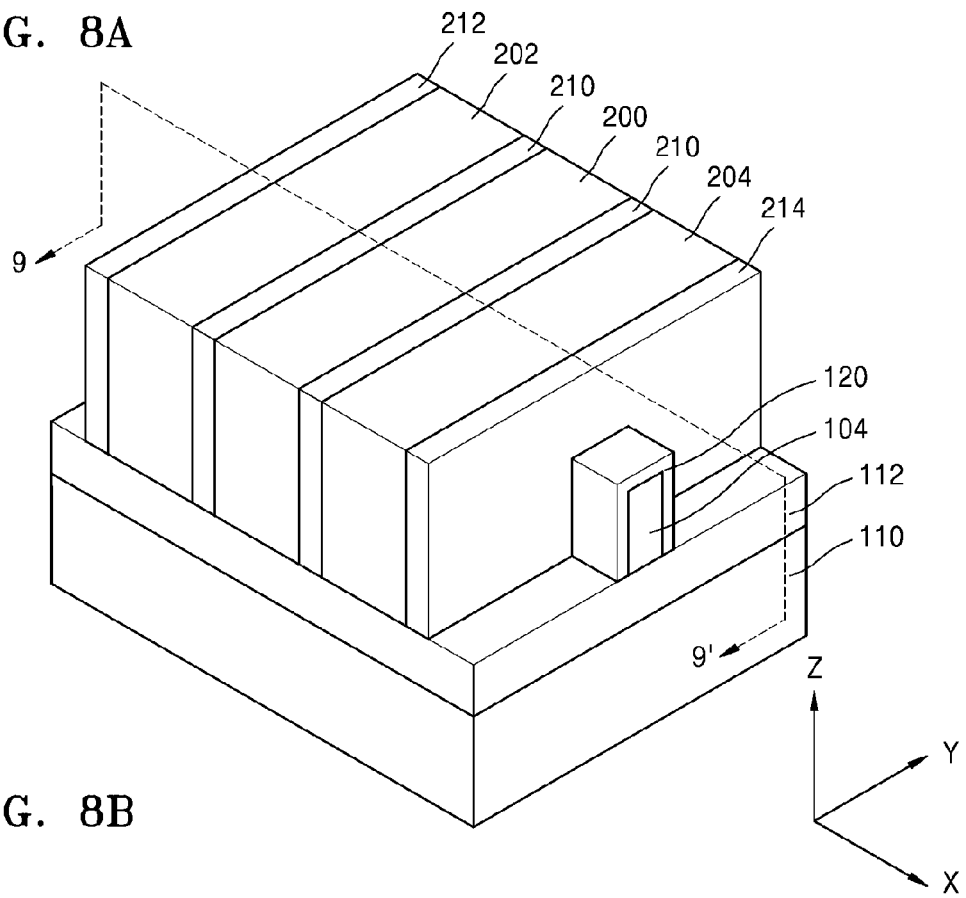
Figure 8B:
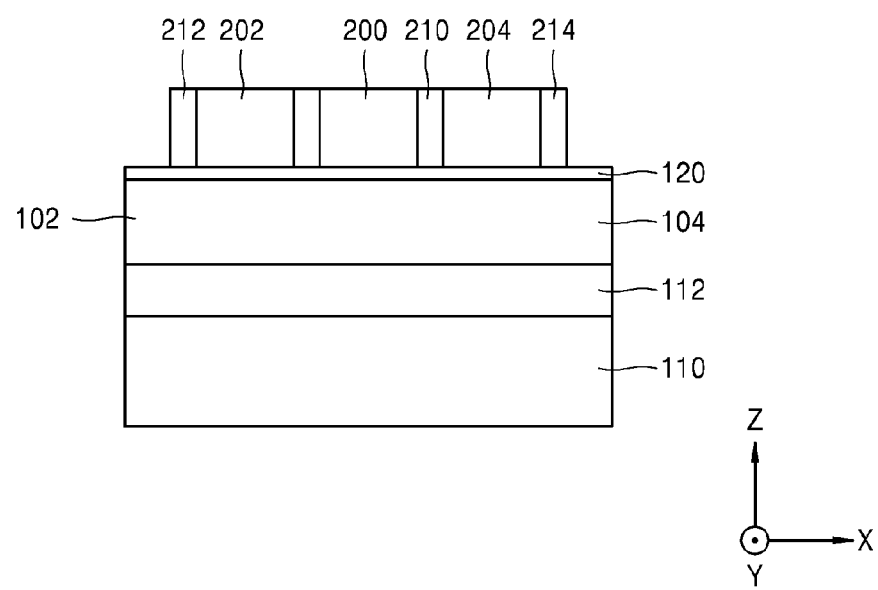

Referring to FIGS. 8A and 8B, a source gate electrode 202 and a drain gate electrode 204 may be formed on two side surfaces of the gate electrode spacers 210, forming a source gate electrode spacer 212 on one side surface of the source gate electrode 202, and forming a drain gate electrode spacer 214 on one side surface of the drain gate electrode 204.

The formation of the source gate electrode 202 may include depositing a material for forming a source gate electrode adjacent to one side surface of the gate electrode 200 in a first direction (X direction) and patterning the material for forming the source gate electrode using a mask. Similarly, the formation of the drain gate electrode 204 may include depositing a material for forming a drain gate electrode adjacent to the other side surface of the gate electrode 200 in the first direction (X direction) and patterning the material for forming the drain gate electrode using a mask. The source gate electrode 202 and the drain gate electrode 204 may be formed of the same conductive material as the gate electrode 202. Because a method of forming the source gate electrode 202 and the drain gate electrode 204 is the same as a method of forming the gate electrode 200, repeated descriptions thereof are omitted.

The source gate electrode spacer 212 may be formed on one side surface of the source gate electrode 202 in the first direction (X direction) (i.e., one side surface on which the gate electrode spacer 210 is not formed). Similarly, the drain gate electrode spacer 214 may be formed on one side surface of the drain gate electrode 204 in the first direction (X direction) (i.e., one side surface on which the gate electrode spacer 210 is not formed). The source gate electrode spacer 212 and the drain gate electrode spacer 214 may be formed using a silicon oxide layer or a silicon nitride layer. Because a method of forming the source gate electrode spacer 212 and the drain gate electrode spacer 214 is the same as a method of forming the gate electrode spacer 210, repeated descriptions thereof are omitted.

Figure 9:
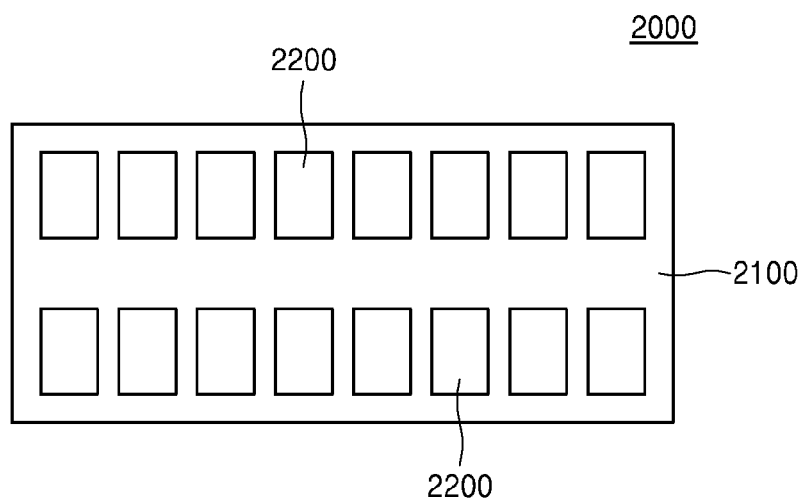
FIG. 9 is a plan view of a memory module including a semiconductor device according to further example embodiments of the inventive concepts.

FIG. 9 is a plan view of a memory module including a semiconductor device according to further example embodiments of the inventive concepts.

Referring to FIG. 9, a memory module 2000 may include a PCB 2100 and a plurality of semiconductor packages 2200.

The plurality of semiconductor packages 2200 may include a semiconductor device according to example embodiments of the inventive concepts.

The memory module 2000 according to example embodiments of the inventive concepts may be a single in-lined memory module (SIMM) in which a plurality of semiconductor packages 2200 are mounted on only one surface of a PCB 2100, or a dual in-lined memory module (DIMM) in which a plurality of semiconductor packages 2200 are arranged on two surfaces of a PCB 2100. Furthermore, the memory module 2000 according to example embodiments of the inventive concepts may be a fully-buffered DIMM (FBDIMM) having an advanced memory buffer (AMB) configured to provide external signals to each of a plurality of semiconductor packages 2200.

Figure 10:
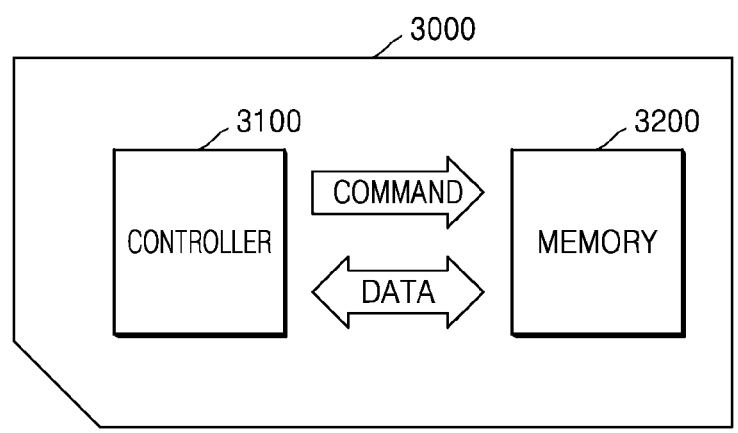
FIG. 10 is a schematic block diagram of a memory card including a semiconductor device according to still other example embodiments of the inventive concepts.

FIG. 10 is a schematic diagram of a memory card including a semiconductor device according to still other exemplary embodiments of the inventive concepts.

Referring to FIG. 10, in a memory card 3000, a controller 3100 and a memory 3200 may exchange electric signals. For example, the memory 3200 and the controller 3100 may exchange data in response to a command of the controller 3100. Thus, the memory card 3000 may store data in the memory 3200 or externally output data from the memory 3200. For example, at least one of the controller 3100 and the memory 3200 may include the semiconductor device described with reference to FIG. 1.

The memory card 3000 may be used as a data storage medium for various portable devices. For example, the memory card 3000 may include a multimedia card (MMC) or a secure digital (SD) card.

Figure 11:
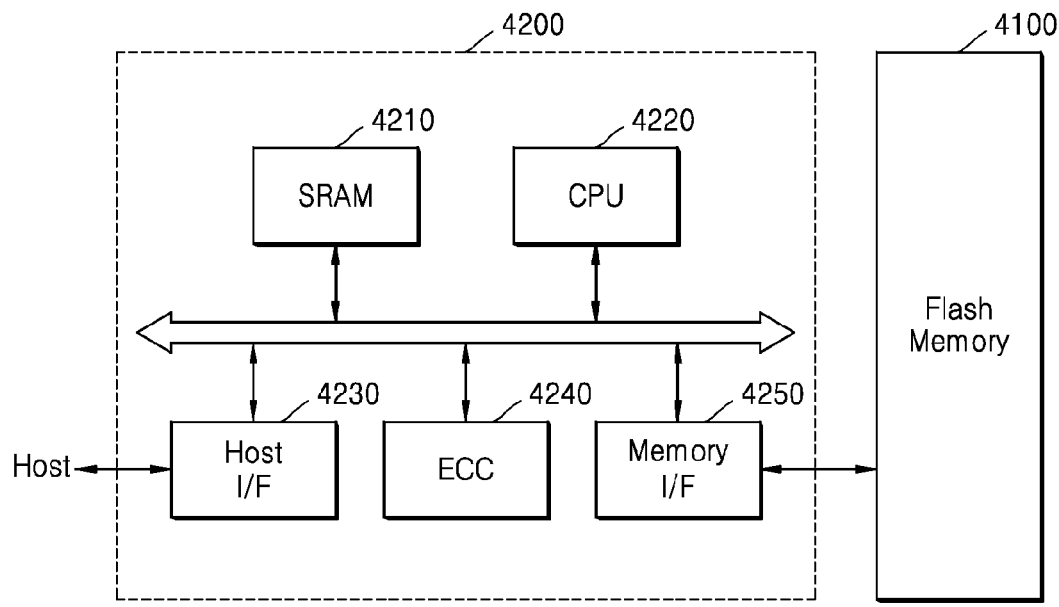
FIG. 11 is a schematic block diagram of a memory device including a semiconductor device according to still further example embodiments of the inventive concepts.

FIG. 11 is a block diagram of an example of a memory device including a semiconductor device according to still further example embodiments of the inventive concepts.

Referring to FIG. 11, a memory device 4000 according to example embodiments of the inventive concepts may include a flash memory module 4100 and a memory controller 4200. The flash memory module 4100 may include the semiconductor device 1000 according to example embodiments of the inventive concepts. Also, the flash memory module 4100 may further include other kinds of semiconductor memory devices (e.g., a non-volatile memory device and/or an SRAM device).

The memory controller 4200 may include a processing unit 4220 configured to control general operations of a memory card. Also, the memory controller 4200 may include an SRAM 4210 used as an operation memory of the processing unit 4220. The SRAM 4210 may include the semiconductor device described with reference to FIG. 1.

Furthermore, the memory controller 4200 may further include a host interface 4230 and a memory interface 4250. The host interface 4230 may include a data exchange protocol between the memory device 4000 and a host. The memory interface 4250 may connect the memory controller 4200 with the flash memory module 4100. In addition, the memory controller 4200 may further include an error correction code (ECC) block 4240. The ECC block 4240 may detect and correct errors in data read from the flash memory module 4100. Although not shown, the memory device 4000 may further include a read-only memory (ROM) device configured to store code data for interfacing with the host. The memory device 4000 may also be embodied by a solid-state disk (SSD) that may replace a hard disk of a computer system.

Figure 12:
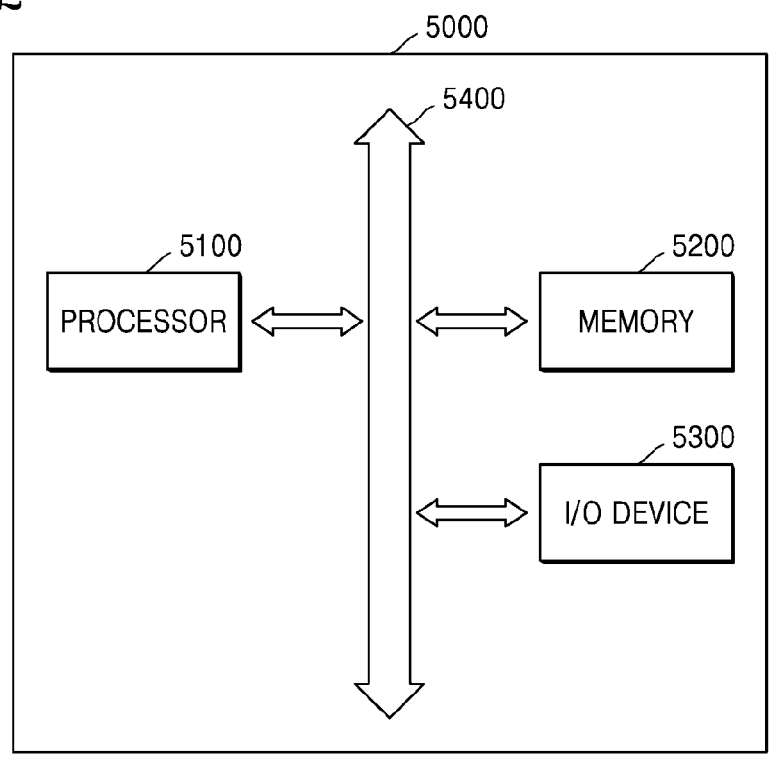
FIG. 12 is a schematic block diagram of an electronic system including a semiconductor device according to even further example embodiments of the inventive concepts.

FIG. 12 is a schematic block diagram of an electronic system including a semiconductor device according to even further example embodiments of the inventive concepts.

Referring to FIG. 12, in an electronic system 5000, a processor 5100, an I/O device 5300, and a memory 5200 may communicate data with one another using a bus 5400. The processor 5100 may execute a program, and control the electronic system 5000. The I/O device 5300 may be used to input or output data of the electronic system 5000. The electronic system 5000 may be connected to an external device (e.g., a personal computer (PC) or a network) using the I/O device 5300 and exchange data with the external device.

The memory 5200 may store codes and/or data for operations of the processor 5100. For example, at least one of the processor 5100 and the memory 5200 may include the semiconductor device described with reference to FIG. 1.

For instance, the electronic system 5000 may constitute various electronic control devices that need the memory 5200. For example, the electronic system 5000 may be used for a mobile phone, an MPEG-1 audio layer 3 (MP3) player, a navigation, an SSD, or household appliances.

The foregoing is illustrative of example embodiments and is not to be construed as limiting thereof. Although a few example embodiments have been described, those skilled in the art will readily appreciate that many modifications are possible in example embodiments without materially departing from the novel teachings. Accordingly, all such modifications are intended to be included within the scope of the disclosure as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
an intrinsic semiconductor region on a substrate;
a source region adjacent to a first side surface of the intrinsic semiconductor region, the source region being doped with a p-type dopant;
a drain region adjacent to a second side surface of the intrinsic semiconductor region, the second side being a reverse side of the first side surface, and the drain region being doped with a p-type dopant;
a gate electrode on the intrinsic semiconductor region;
a source gate electrode on the source region;
a drain gate electrode on the drain region; and
a gate insulating layer interposed between the source gate electrode and the source region and between the drain gate electrode and the drain region.

2. The device of claim 1, wherein, when an external voltage is applied to the drain gate electrode, the drain gate electrode induces a tunneling field effect between the source region and the intrinsic semiconductor region.

3. The device of claim 1, wherein each of the intrinsic semiconductor region, the source region, and the drain region has a fin shape that protrudes to a set height in a direction perpendicular to a top surface of the substrate, and extends in a first direction parallel to the top surface of the substrate.

4. The device of claim 3, wherein
the gate electrode covers top and side surfaces of the intrinsic semiconductor region,
the source gate electrode covers top and side surfaces of the source region,
the drain gate electrode covers top and side surfaces of the drain region,
the gate electrode, the source gate electrode, and the drain gate electrode are arranged parallel to one another, and extend in a second direction perpendicular to the first direction.

5. The device of claim 1, further comprising:
gate electrode spacers interposed between the gate electrode and the source gate electrode, and between the gate electrode and the drain gate electrode,
the gate electrode spacers extending in a direction parallel to the gate electrode.

6. The device of claim 1, wherein
a top surface of one of two side end portions of the source region is exposed, the one of two side end portions not being adjacent to the intrinsic semiconductor region, and
a top surface of one of two side end portions of the drain region is exposed, the one of two side end portions not being adjacent to the intrinsic semiconductor region.

7. The device of claim 1, further comprising:
a source gate spacer in contact with a reverse side of one side surface adjacent to the gate electrode, from among two side surfaces of the source gate electrode,
the source gate spacer extending in a direction parallel to the source gate electrode.

8. The device of claim 1, further comprising:
a drain gate spacer in contact with a reverse side of one side surface adjacent to the gate electrode, from among two side surfaces of the drain gate electrode, and
the drain gate spacer extending in a direction parallel to the drain gate electrode.

9. The device of claim 1, wherein
the intrinsic semiconductor region is formed of silicon (Si), and
the source region and the drain region are formed of germanium (Ge).

10. A semiconductor device, comprising:
a semiconductor layer on a substrate, the semiconductor layer extending in a first direction;
a plurality of gate electrodes covering top and side surfaces of the semiconductor layer, the plurality of gate electrodes extending in a second direction perpendicular to the first direction; and
a gate insulating layer interposed between the plurality of gate electrodes and the semiconductor layer,
the semiconductor layer including an intrinsic semiconductor region, a source region formed adjacent to a first side surface of the intrinsic semiconductor region, and a drain region formed adjacent to a second side surface of the intrinsic semiconductor region, the source region and the drain region being doped with impurities of the same polarity, and the gate insulating layer being interposed between the plurality of gate electrodes and the source region and between the plurality of gate electrodes and the drain region.

11. The device of claim 10, wherein the source region and the drain region are doped with a p-type dopant.

12. The device of claim 10, wherein the semiconductor layer protrudes to a set height in a third direction perpendicular to a top surface of the substrate.

13. The device of claim 10, wherein the plurality of gate electrodes comprise a first gate electrode, a second gate electrode, and a third gate electrode, the first gate electrode covers top and side surfaces of the intrinsic semiconductor region, the second gate electrode covers top and side surfaces of the source region, and the third gate electrode covers top and side surfaces of the drain region.

14. The device of claim 10, wherein gate electrode spacers are interposed between the plurality of gate electrodes and electrically insulate the plurality of gate electrodes from one another.

15. The device of claim 10, further comprising:

a buried insulating layer interposed between the semiconductor layer and the substrate.

16. A semiconductor device, comprising:

a semiconductor layer consisting of a first semiconductor region interposed between a second semiconductor region and a third semiconductor region, the first semiconductor region being an undoped semiconductor region or an i-type semiconductor region, and the second and third semiconductor regions each being formed of a material having a smaller work function than a material forming the first semiconductor region;

a metal pattern insulated from the semiconductor layer, the metal pattern including a plurality of gate electrodes over a respective one of the first, second and third semiconductor regions; and a gate insulating layer interposed between the plurality of gate electrodes and the semiconductor layer, the gate insulating layer being interposed between the plurality of gate electrodes and the second region and between the plurality of gate electrodes and the third region.

17. The semiconductor device of claim 16, wherein a dopant concentration of the second and third semiconductor regions is about $1\times10^{18}$ cm$^{-3}$ to about $1\times10^{18}$ cm$^{-3}$.

18. The semiconductor device of claim 16, wherein the metal pattern extends in a first direction over the semiconductor layer, and the semiconductor layer extends in a second direction over a substrate, the second direction being substantially perpendicular to the first direction.

19. The semiconductor device of claim 16, wherein the plurality of gate electrodes are electrically insulated from each other.

20. The semiconductor device of claim 16, wherein the second and third semiconductor regions include p-type dopants or n-type dopants.

* * * * *